(12) United States Patent
Ramin et al.

(10) Patent No.: US 8,748,246 B2
(45) Date of Patent: Jun. 10, 2014

(54) INTEGRATION SCHEME FOR DUAL WORK FUNCTION METAL GATES

(75) Inventors: Manfred Ramin, Austin, TX (US); Michael Pas, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 103 days.

(21) Appl. No.: 12/965,528

(22) Filed: Dec. 10, 2010

(65) Prior Publication Data

US 2011/0223754 A1 Sep. 15, 2011

Related U.S. Application Data

(60) Continuation of application No. 12/255,500, filed on Oct. 21, 2008, now abandoned, which is a division of application No. 11/694,662, filed on Mar. 30, 2007, now abandoned.

(51) Int. Cl.
 *H01L 21/8238* (2006.01)
(52) U.S. Cl.
 USPC ..... 438/199; 438/200; 438/581; 257/E27.046
(58) Field of Classification Search
 CPC ............... H01L 27/1214; H01L 21/823842; H01L 29/665; H01L 29/6659; H01L 29/7833; H01L 29/7869; H01L 51/0002; H01L 21/8252; H01L 27/105; H01L 21/32051

USPC .......... 438/199–202, 581–583; 257/E27.046, 257/E27.064

See application file for complete search history.

(56) References Cited

U.S. PATENT DOCUMENTS

| | | | |
|---|---|---|---|
| 7,807,522 B2 | 10/2010 | Alshareef et al. | |
| 8,304,342 B2 * | 11/2012 | Pas et al. | 438/651 |
| 2005/0095825 A1 | 5/2005 | Saito et al. | |
| 2005/0263824 A1 | 12/2005 | Nakajima | |
| 2006/0014368 A1 | 1/2006 | Peng et al. | |
| 2006/0134844 A1 | 6/2006 | Lu et al. | |
| 2006/0148181 A1 | 7/2006 | Chan et al. | |
| 2006/0286802 A1 * | 12/2006 | Yu et al. | 438/682 |
| 2007/0066043 A1 * | 3/2007 | Yoshimura | 438/598 |
| 2007/0096157 A1 * | 5/2007 | Nabatame et al. | 257/213 |
| 2007/0126063 A1 | 6/2007 | Aoyama | |
| 2008/0102634 A1 * | 5/2008 | Pas et al. | 438/692 |
| 2008/0224239 A1 * | 9/2008 | Lin et al. | 257/411 |

* cited by examiner

*Primary Examiner* — H Tsai
(74) *Attorney, Agent, or Firm* — Alan A. R. Cooper; W. James Brady, III; Frederick J. Telecky, Jr.

(57) ABSTRACT

A transistor includes a semiconductor substrate includes having a gate hardmask over the gate electrode layer during the formation of transistor source/drain regions. An independent work function adjustment process implants Group IIIa series dopants into a gate polysilicon layer of a PMOS transistor and implants lanthanide series dopants into a gate polysilicon layer of a NMOS transistor.

27 Claims, 13 Drawing Sheets

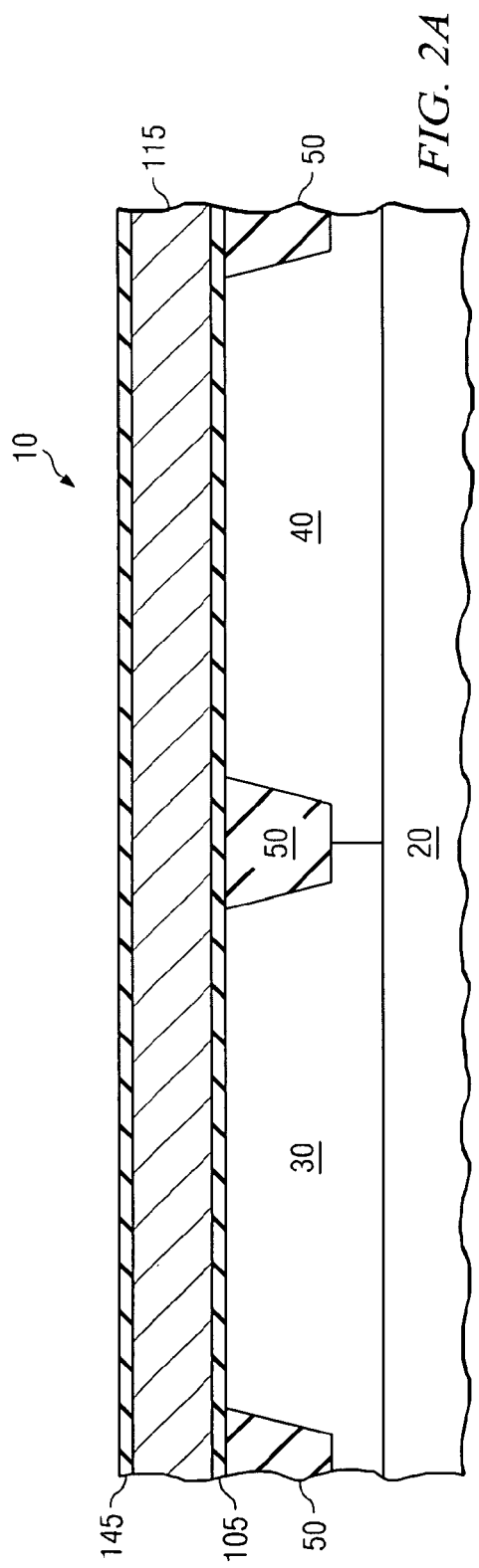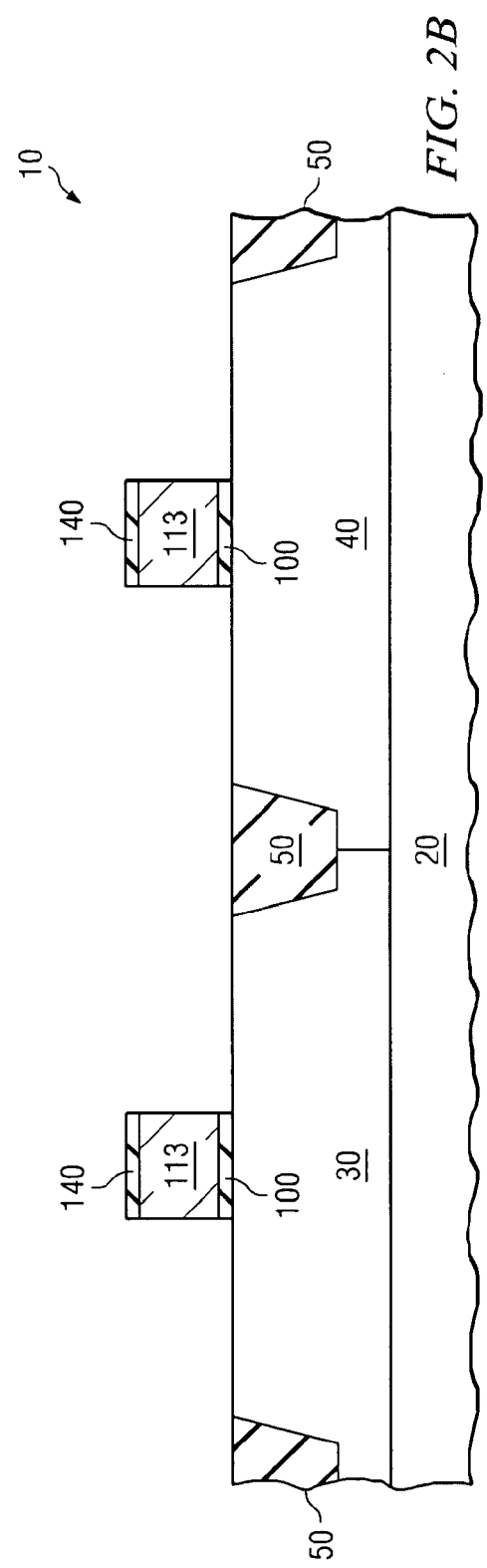

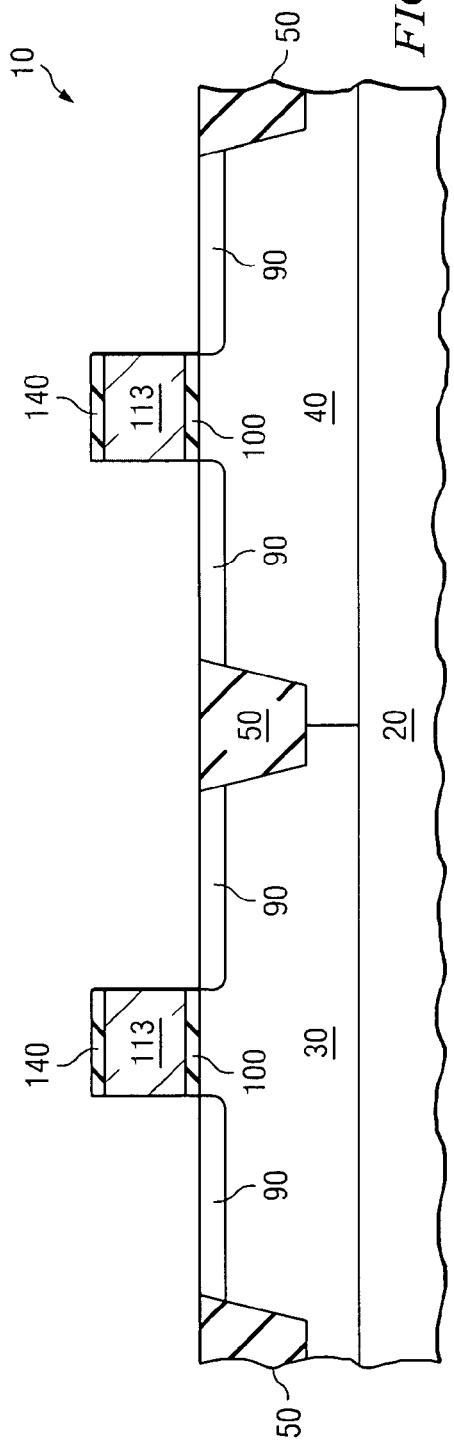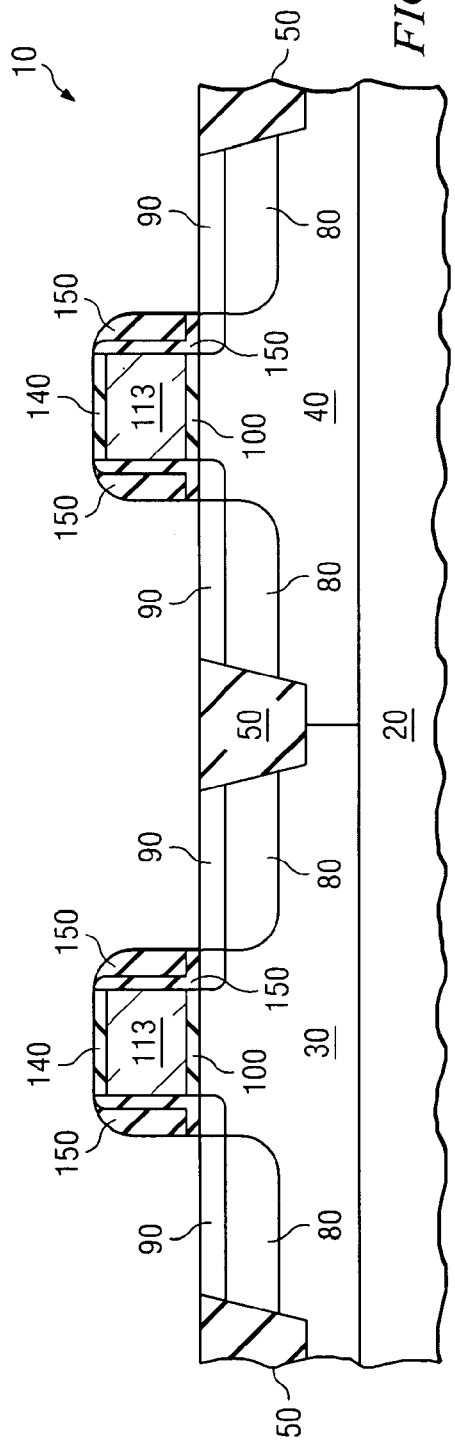

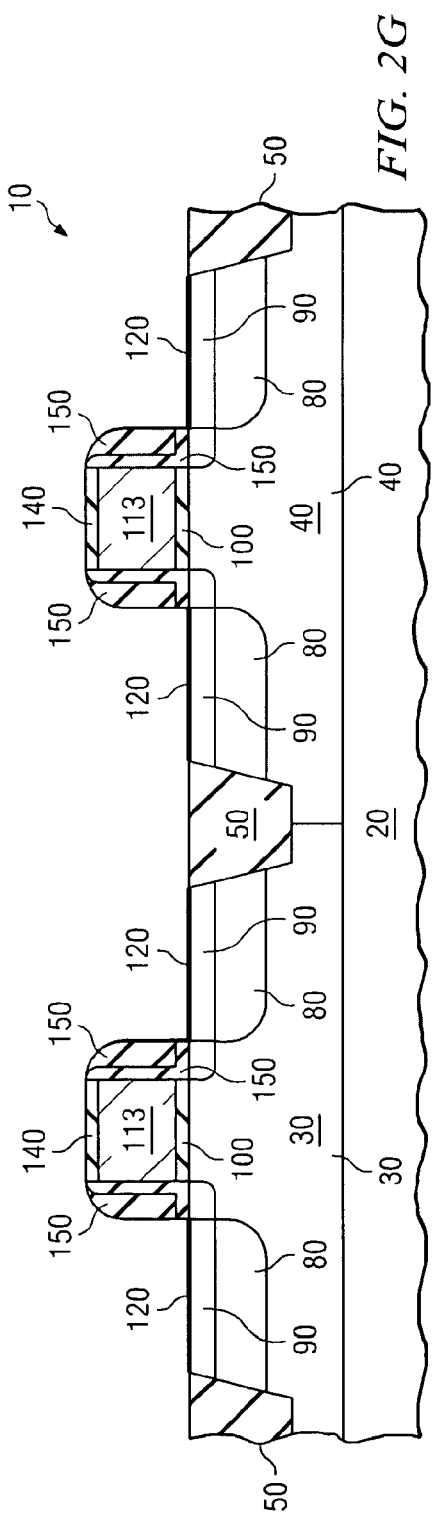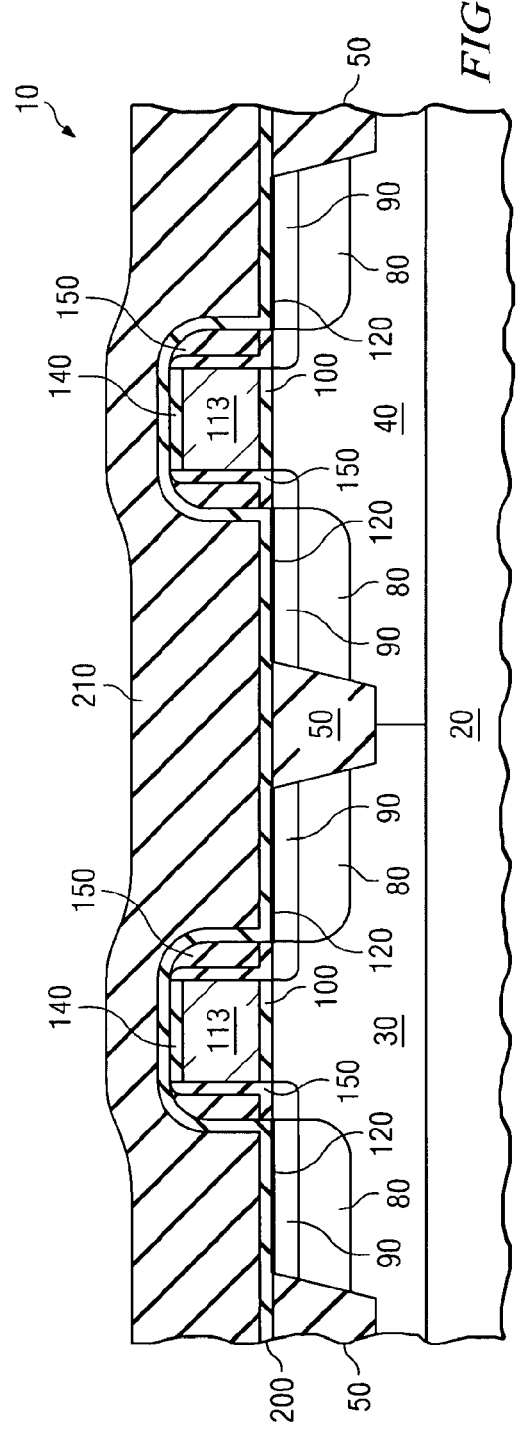

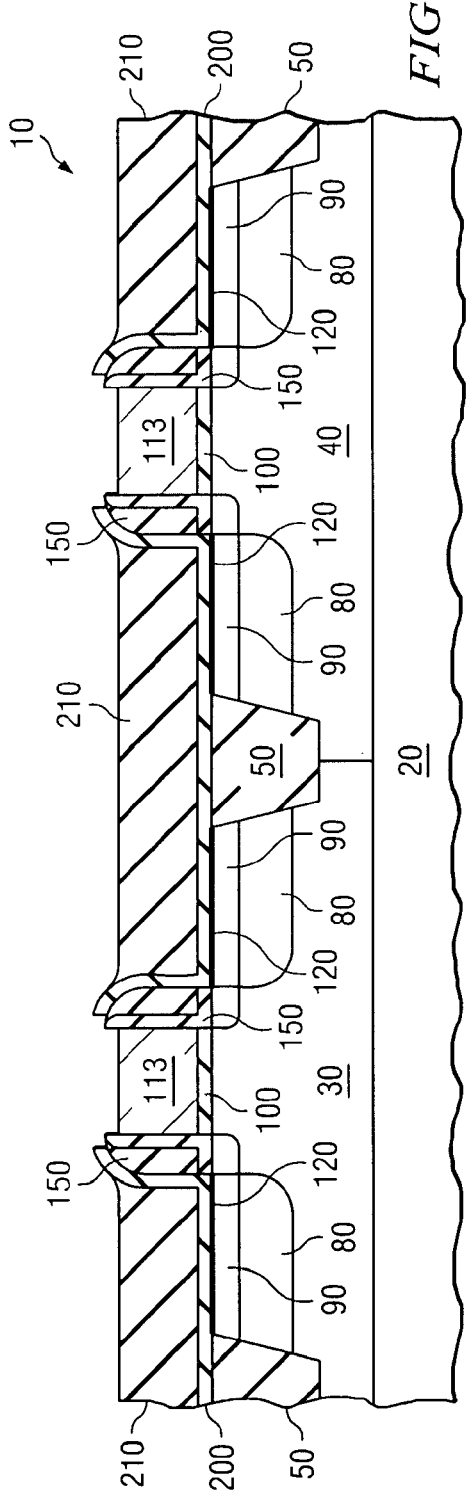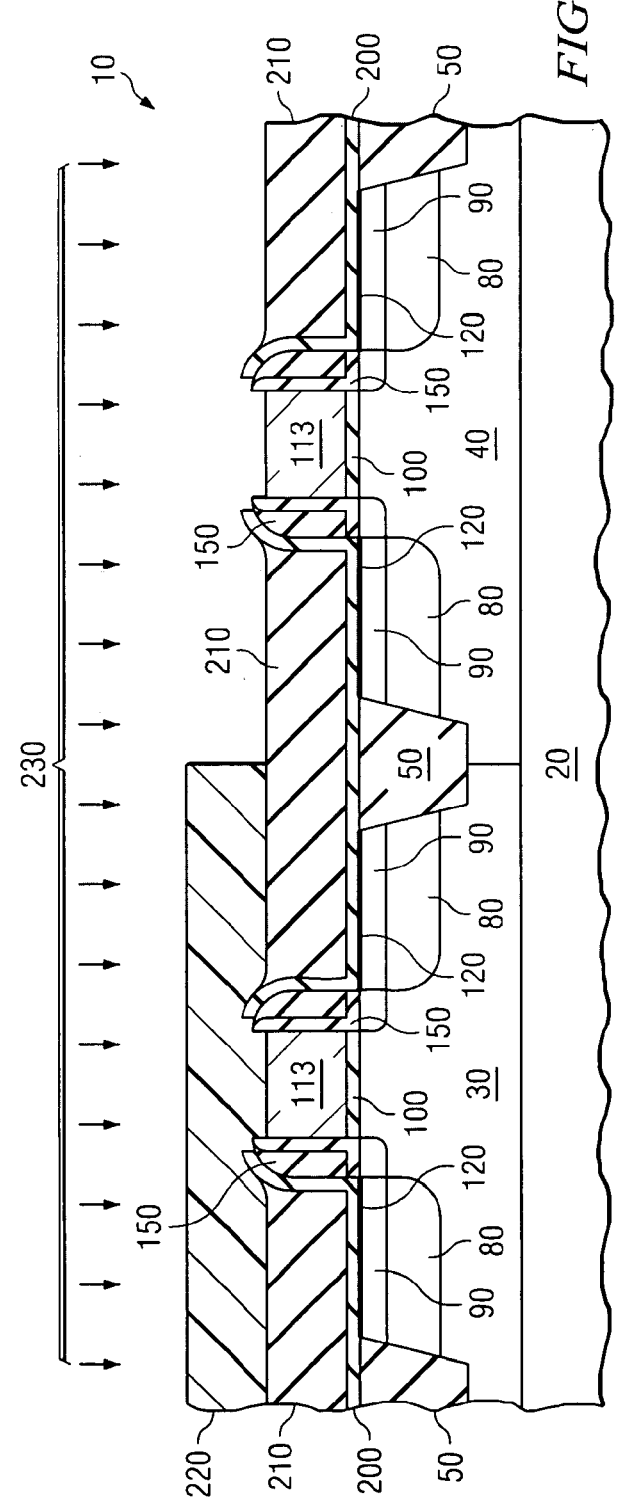

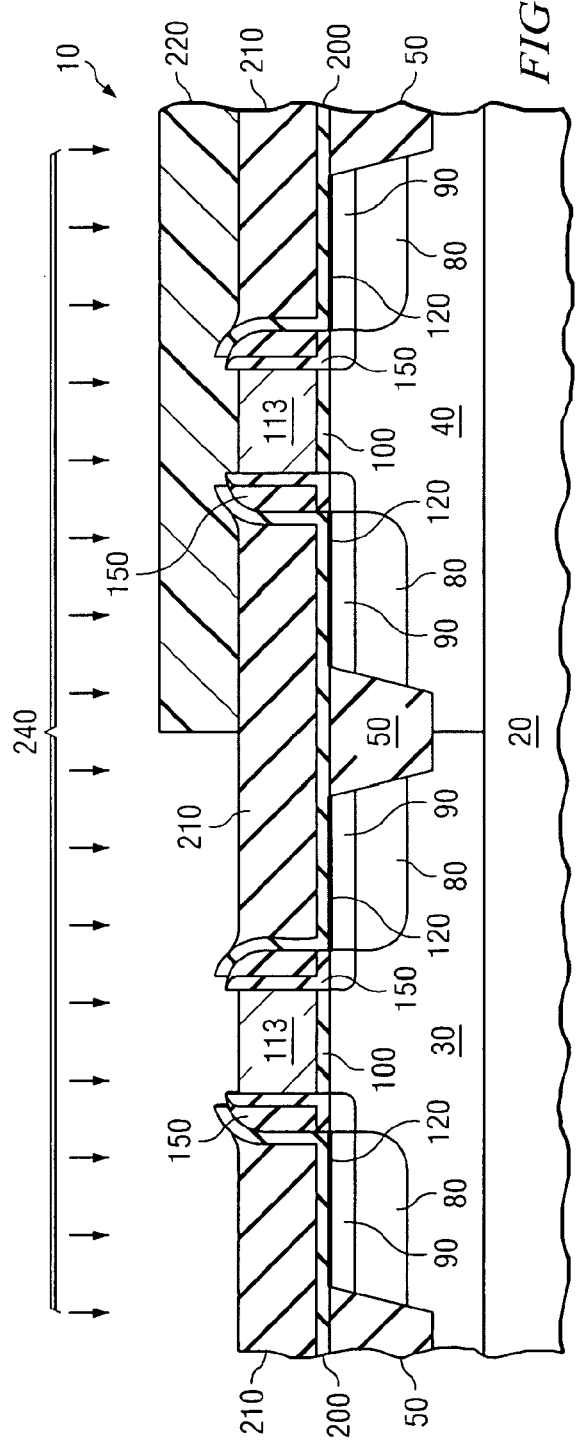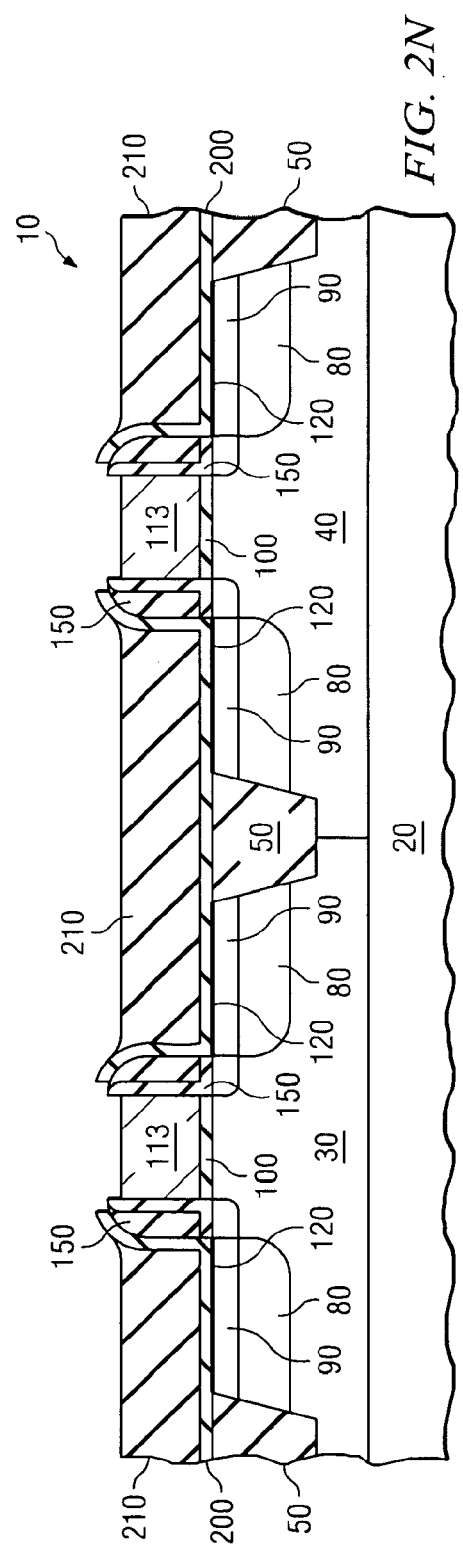

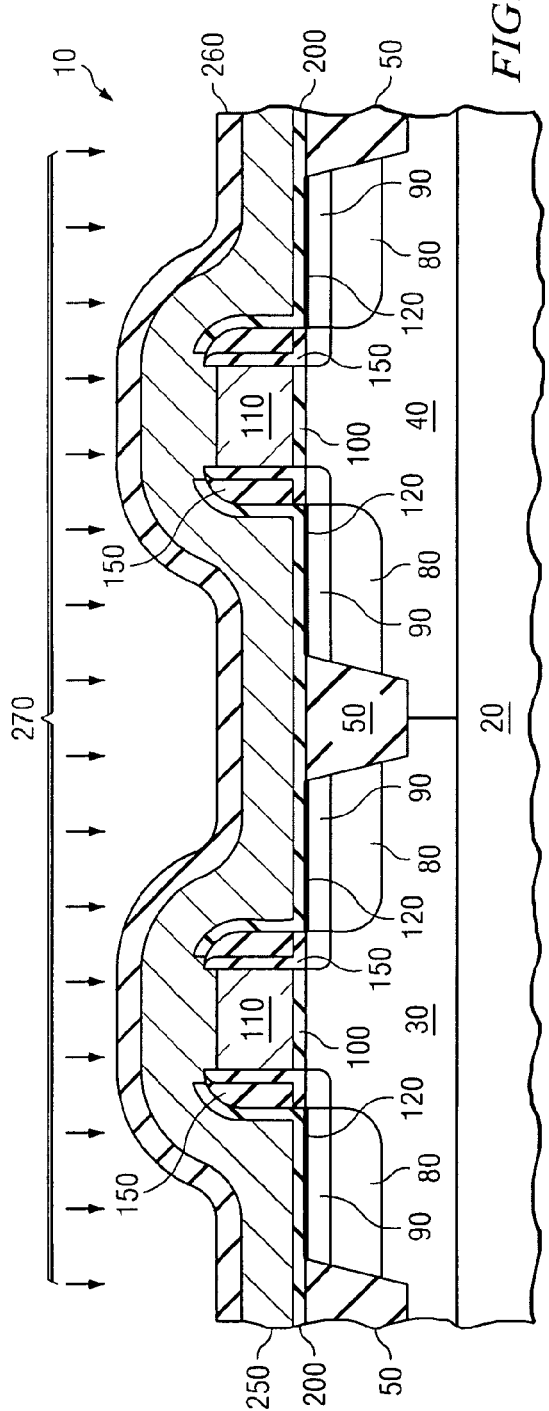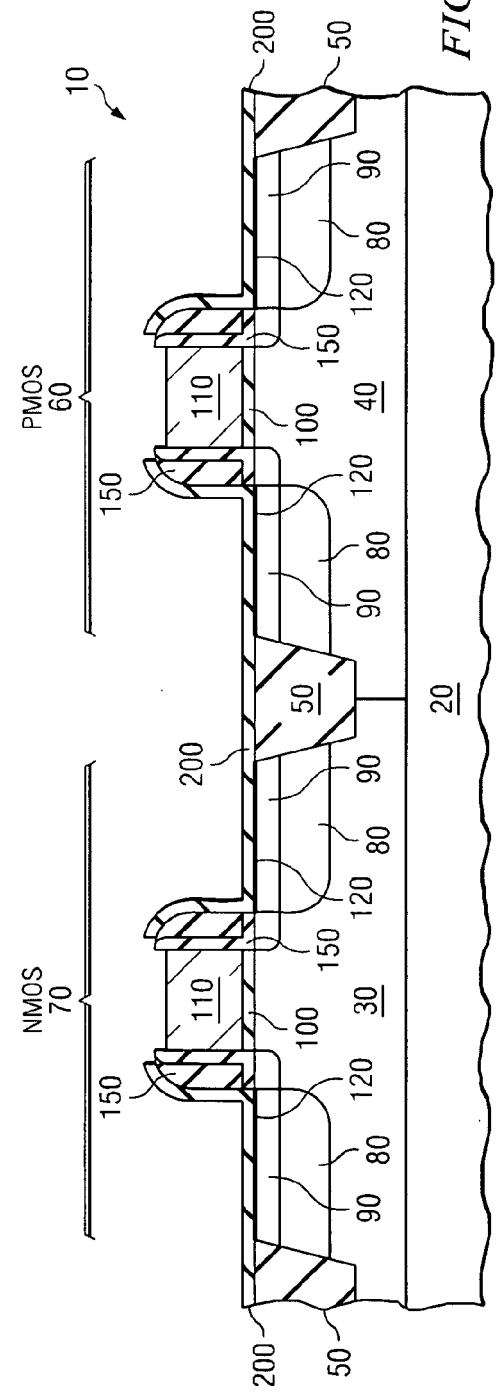

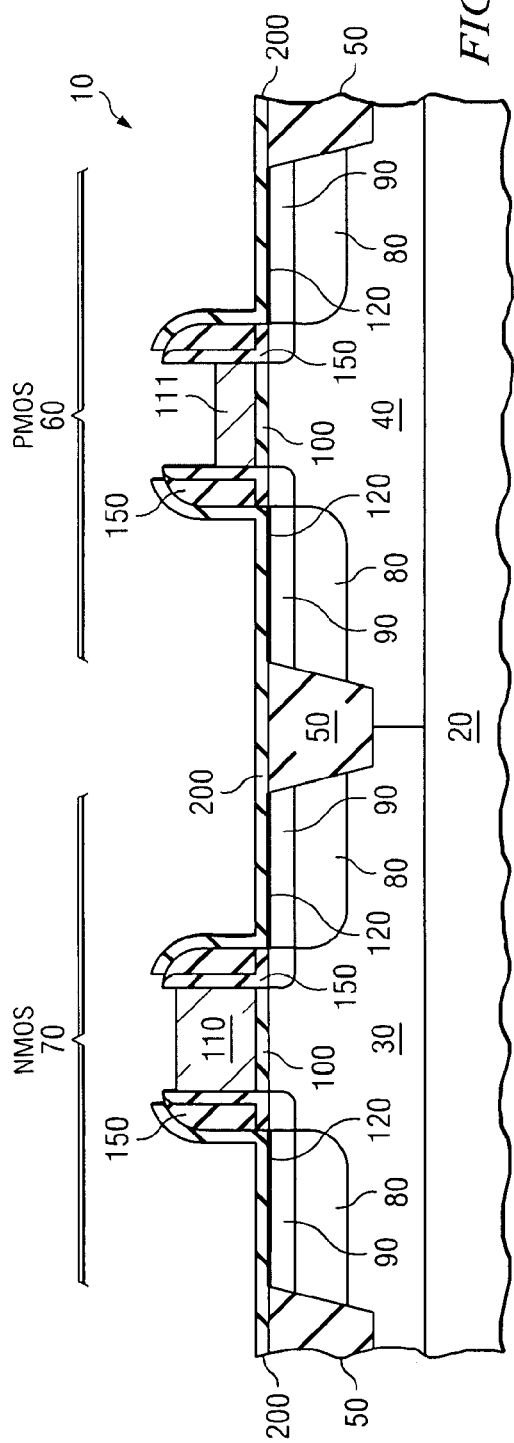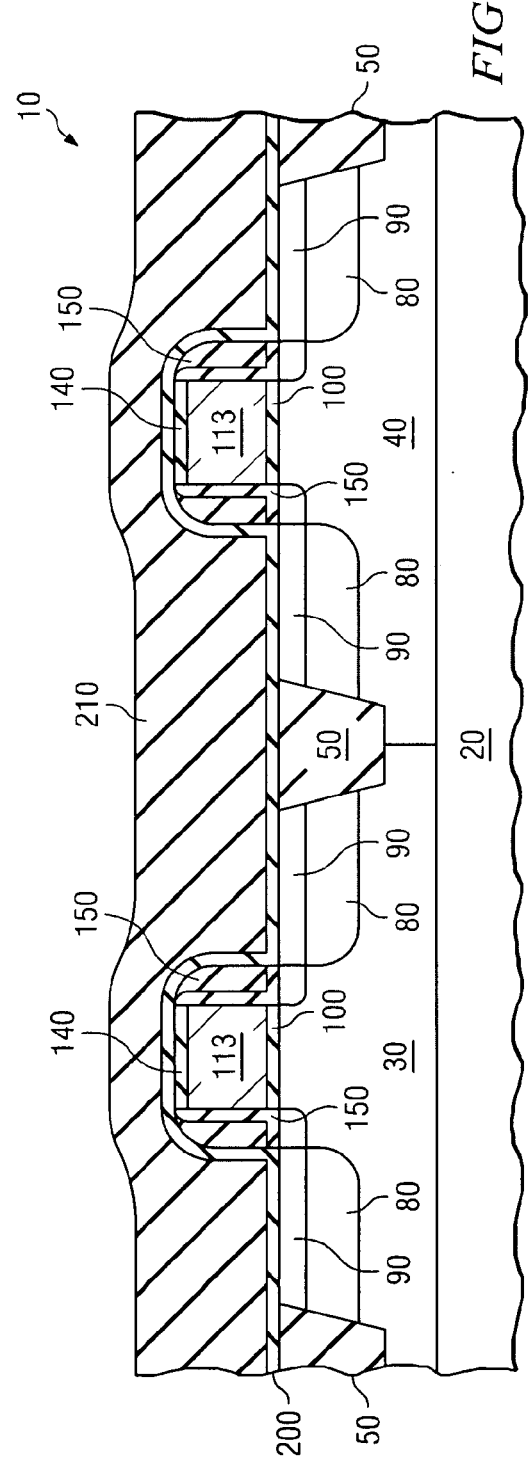

INTEGRATION SCHEME FOR DUAL WORK FUNCTION METAL GATES

This is a continuation of application Ser. No. 12/255,500 filed Oct. 21, 2008, which is a division of application Ser. No. 11/694,662 filed Mar. 30, 2007, the entireties of both of which are incorporated herein by reference.

BACKGROUND

This invention relates to the fabrication of dual work function metal gates for CMOS devices.

BRIEF DESCRIPTION OF THE DRAWINGS

Example embodiments are described below, with reference to the accompanying drawings, wherein:

FIGS. 3A-3E are cross-sectional diagrams of a process for forming a transistor in accordance with an alternative embodiment of the present invention.

DETAILED DESCRIPTION OF EXAMPLE EMBODIMENTS

Figure 1:
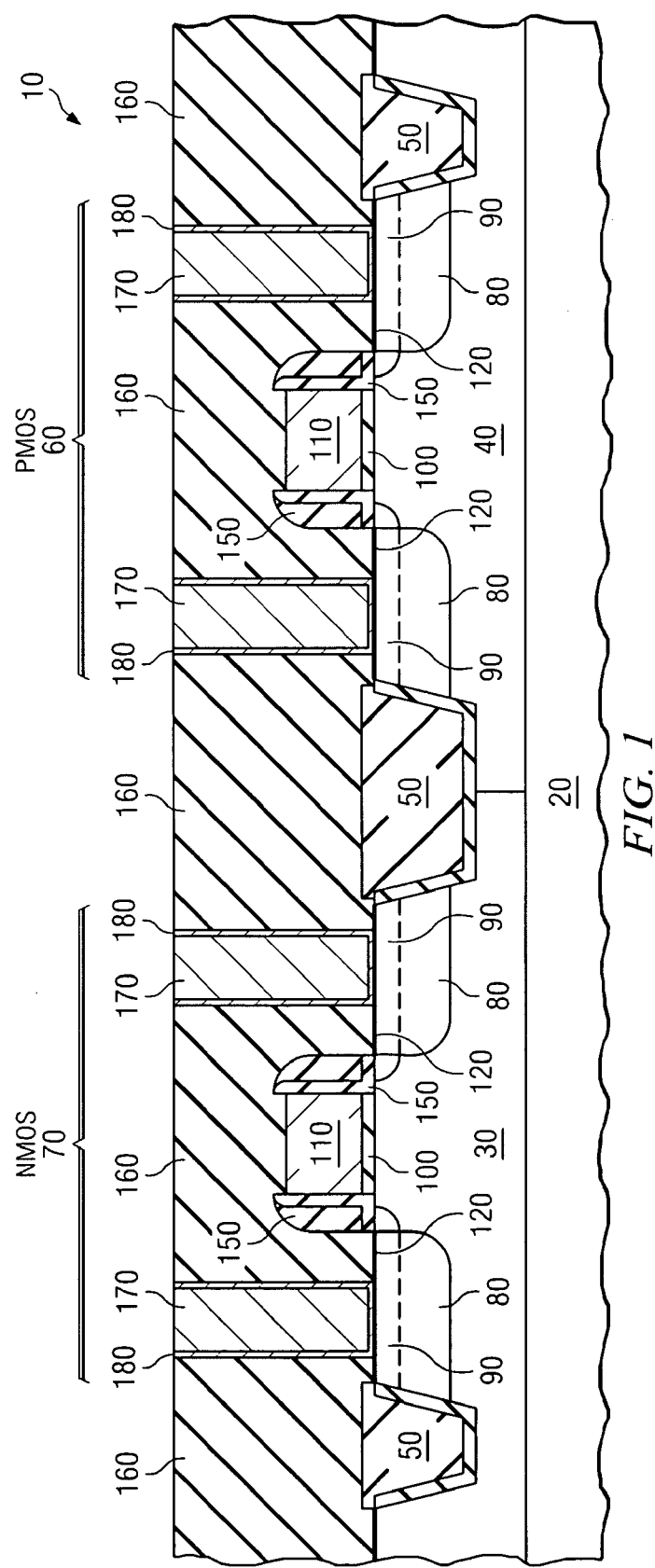
FIG. 1 is a cross-sectional view of a semiconductor structure in accordance with the present invention.

FIG. 1 illustrates a semiconductor wafer 10 in accordance with the invention. In the example application, CMOS transistors 60, 70 are formed within a semiconductor substrate 20 having a p-well 30 containing the NMOS transistor 70 and an n-well 40 containing PMOS transistor 60.

The CMOS transistors 60, 70 are electrically insulated from other active devices located within the semiconductor wafer 10 by shallow trench isolation structures 50 formed within the semiconductor substrate 20; however, any conventional isolation structure may be used such as field oxide regions or implanted isolation regions. The semiconductor substrate 20 may be a single-crystalline substrate that is doped with n-type and p-type dopants; however, it may also be silicon germanium ("SiGe") substrate, a silicon-on-insulator ("SOI") substrate, or a single-crystalline substrate having an epitaxial silicon layer that is doped with n-type and p-type dopants.

Transistors, such as CMOS transistors 60, 70, are generally comprised of a gate, source, and drain. More specifically, as shown in FIG. 1, the active portion of the CMOS transistors are comprised of source/drain regions 80, source/drain extension regions 90, and a gate stack that is comprised of a gate dielectric 100 and gate electrode 110.

The example PMOS transistor 60 is a p-channel MOS transistor. Therefore it is formed within an n-well region 40 of the semiconductor substrate 20. In addition, the deep source/drain regions 80 and the extension regions 90 have p-type dopants, such as boron. The extension regions 90 may be lightly doped ("LDD"), medium doped ("MDD"), or highly doped ("HDD"). However, sources/drain regions 80 are usually heavily doped. The PMOS gate stack is initially comprised of a p-type doped polysilicon electrode 113 and gate oxide dielectric 100. Subsequent fabrication (described below) adds additional dopants to adjust the work function of the PMOS transistor 60 and then converts the polysilicon electrode 113 to a fully silicided ("FUSI") gate electrode 110.

The example NMOS transistor 70 is an n-channel MOS transistor. Therefore it is formed within a p-well region 30 of the semiconductor substrate 20. In addition, the deep sources and drains 80 and the source and drain extensions 90 have n-type dopants such as arsenic, phosphorous, antimony, or a combination of n-type dopants. The extension regions 90 may be LDD, MDD, or HDD. However, sources/drain regions 80 are usually heavily doped. The NMOS gate stack is initially comprised of an n-type doped polysilicon electrode 113 and gate oxide dielectric 100. Subsequent fabrication adds additional dopants to adjust the work function of the NMOS transistor 70 and then converts the polysilicon electrode 113 to a fully silicided ("FUSI") gate electrode 110.

An offset structure comprising source/drain sidewalls 150 is used during fabrication to enable the proper placement of the source/drain regions 80. More specifically, the sources/drain regions 80 are formed with the gate stack and source/drain sidewalls 150 as a mask. The extension regions 90 are formed with the gate stack as a mask in the example embodiment. However, it is within the scope of the invention to form the extension regions 90 using the gate stack plus extension sidewalls that are located proximate the gate stack as a mask.

The sources/drain regions 80 have a layer of silicide 120 that is formed within the top surface of the sources/drain regions 80 during the fabrication process (as described below). The silicide layer 120 formed within the top surface of the sources/drain regions 80 is preferably NiSi or $Ni_2Si$; however, it is within the scope of the invention to fabricate the silicide 120 with other metals (such as cobalt, platinum, titanium, tantalum, molybdenum, tungsten, or alloys of these metals). In the example application, the silicide layer 120 that is formed on the top surface of the sources/drain regions 80 is a self-aligned silicide (i.e. a "salicide"). Generally, the source/drain silicide layer 120 is NiSi, $Ni_2Si$, or other Ni rich phase of nickel silicide for PMOS transistors 60 and NiSi for NMOS transistors 70. However, where a single electrode phase is used in both electrodes, then Ni rich or NiSi is used in both (NMOS and PMOS) transistors.

The gate electrode 110 is also silicided during the semiconductor fabrication process (as also described below). The purpose of the silicide formed within the gate electrode 110 and the top portion of the sources/drain regions 80 is the reduction of the contact resistance between the transistors 60, 70 and the electrical contacts 170, 180. The FUSI gate electrode 110 is fully silicided ("FUSI") and is preferably comprised of NiSi or $Ni_2Si$; however, other metals may be used, such as cobalt, platinum, titanium, tantalum, molybdenum, tungsten, or an alloy.

A layer of dielectric insulation 160 surrounds the transistors 60, 70. The composition of dielectric insulation 160 may be any suitable material such as $SiO_2$, tetraethylorthosilicate ("TEOS"), or organosilicate glass ("OSG"). The dielectric material 160 electrically insulates the metal contacts 170 (and contact liners 180) that electrically connect the CMOS transistors 60, 70 to other active or passive devices that are located throughout the semiconductor wafer 10. An optional dielectric liner (not shown in FIG. 1) may be formed before the placement of the dielectric insulation layer 160. If used, the dielectric liner may be any suitable material such as silicon nitride.

In this example application, the contacts 170 are comprised of W; however, any suitable material (such as Cu, Ti, Al, or an alloy) may be used. In addition, an optional liner material 180 such as Ti, TiN, or Ta (or any combination or layer stack thereof) may be used to reduce the contact resistance at the interface between the contacts 170 and the selected FUSI gate electrode 110 or silicided sources/drain regions 80.

Subsequent fabrication will create the "back-end" portion of the integrated circuit. The back-end generally contains one or more interconnect layers (and possibly via layers) that properly route electrical signals and power though out the completed integrated circuit.

In the example application shown in FIG. 1, the FUSI gate electrode 110 of NMOS transistor 70 is doped with an element, such as Yb (ytterbium), from the lanthanide series to shift the work function of the NMOS transistor 70. It is also within the scope of the invention to implant additional n-type dopants into the FUSI gate electrode 110, such as As, in order to reduce (i.e. scale down) the work function enhancement that results from the presence of the lanthanide element dopant. Moreover, the gate dielectric 100 of the NMOS transistor 70 also contains dopants, such as Yb (ytterbium), from the lanthanide series. For example, the lanthanide series dopant Yb will react with the oxygen in the gate dielectric to form $Yb_2O_3$. (Note that the heaviest concentration of $Yb_2O_3$ will be along the interface between the dielectric 100 and the Yb doped FUSI electrode 110.) The presence of Yb in the gate dielectric may increase the dielectric constant ("k") value of the gate dielectric 100.

Similarly, the FUSI gate electrode 110 of PMOS transistor 60 is doped with an element, such as Ga (gallium), from the Group IIIa series to shift the work function of the PMOS transistor 60. It is also within the scope of the invention to oxidize the Group IIIa dopant in order to accelerate (i.e. increase) the work function enhancement that results from the presence of the Group IIIa element dopant or its oxide. Moreover, the gate dielectric 100 of the PMOS transistor 60 also contains dopants, such as Ga, from the Group IIIa series. For example, the Group IIIa series dopant Ga will react with the oxygen in the gate dielectric to form $Ga_2O_3$. (Note that the heaviest concentration of $Ga_2O_3$ will be along the interface between the dielectric 100 and the Ga doped FUSI electrode 110.) The presence of Ga in the gate dielectric may increase the dielectric constant ("k") value of the gate dielectric 100.

Referring again to the drawings, FIGS. 2A-2S are cross-sectional views of a partially fabricated semiconductor wafer 10 illustrating a process for forming an example PMOS transistor 60 and NMOS transistor 70 in accordance with the present invention. The following example application is exemplary but not restrictive of alternative ways of implementing the principles of the invention. Moreover, features and procedures whose implementations are well known to those skilled in the art are omitted for brevity. For example, the implementation of common fabrication steps lies within the ability of those skilled in the art and accordingly any detailed discussion thereof may be omitted.

FIG. 2A is a cross-sectional view of the semiconductor wafer 10 after the formation of the gate oxide layer 105 and the gate polysilicon layer 115 on the top surface of a semiconductor substrate 20. In the example application, the semiconductor substrate 20 is silicon; however any suitable material such as germanium or gallium arsenide may be used. The semiconductor substrate 20 contains a p-well 30 for the NMOS transistor 70 and an n-well 40 for the PMOS transistor 60. In addition, the semiconductor substrate 20 contains shallow trench isolation structures 50 that are formed using any suitable standard process.

The gate oxide layer 105 and the gate polysilicon layer 115 are formed using well-known manufacturing techniques. The first layer formed over the surface of the semiconductor substrate 20 is a gate dielectric oxide layer 105. As an example, the gate dielectric layer 105 is silicon dioxide that is 10-50 Å thick and it is formed with a thermal oxidation process. However, the gate dielectric layer 105 may be any suitable material, such as plasma nitrided silicon oxide, silicon nitride, or a high-k gate dielectric material, and it may be formed using any one of a variety of standard processes such as an oxidation process, thermal nitridation, atomic layer deposition ("ALD"), plasma nitridation, physical vapor deposition ("PVD"), or chemical vapor deposition ("CVD").

A gate electrode polysilicon layer 115 is then formed on the surface of the gate dielectric layer 105. The gate electrode layer 115 is comprised of polycrystalline silicon and it is 500-1500 Å thick in the example application. However, it is within the scope of the invention to use other materials such as an amorphous silicon, a silicon alloy (e.g. SiGe), or other suitable materials. The gate electrode layer 115 may be formed using any standard process technique such as CVD or PVD. In addition, the gate polysilicon layer 115 may be any suitable thickness, such as 500-1500 Å.

In accordance with the example embodiment, a gate hardmask layer 145 is then formed on the surface of the gate electrode layer 115. The gate hardmask layer 145 is comprised of silicon dioxide ($SiO_2$) in the example application. However, it is within the scope of the invention to use other materials such as amorphous silicon, silicon-rich nitride, SiON, SiC, tetraethylorthosilicate ("TEOS"), plasma tetra Ethyl Oxysilane ("PTEOS"), or a combinational stack of these materials. Preferably, the gate hardmask layer 145 is formed with a rapid thermal CVD ("RTCVD") process using silane or dichlorosilane and ammonia precursors; however, any suitable process may be used. In addition, the gate hardmask layer 145 may be any suitable thickness, such as 100-600 Å. The purpose of the gate hardmask layer 145 is to protect the gate polysilicon layer 113 during the source/drain formation and silicidation processes (described below).

After a pattern and etch process, a gate stack having a gate dielectric 100, a gate electrode 113, and gate hardmask 140 will be formed from the gate oxide layer 105, the gate polysilicon layer 115, and the gate hardmask 145, respectively. This gate stack, shown in FIG. 2B, may be created through a variety of processes. For example, the gate stack may be created by forming a layer of photoresist over the semiconductor wafer, patterning the photoresist, and then using the photoresist pattern to etch the gate oxide layer 105, the doped gate polysilicon layer 115, and the hardmask layer 145. The gate stack is etched using any suitable etch process that is capable of etching polysilicon doped with lanthanide or Group IIIa, such as an anisotropic etch using plasma or reactive ions.

The fabrication of the PMOS transistors 60 and the NMOS transistors 70 now continues with standard process steps. Generally, the next step is the formation of the extension regions 90 using the gate stack as a template, as shown in FIG. 2C. The extension regions 90 are formed near the top surface of the semiconductor substrate 20 using any standard process. For example, the extension regions 90 may be formed by low-energy ion implantation, gas phase diffusion, or solid phase diffusion. The dopants used to create the extension regions 90 for a PMOS transistor 120 are p-type (i.e. boron). The dopants used to create the extension regions 90 for a NMOS transistor 70 are n-type (i.e. phosphorous or arsenic). However, other dopants or combinations of dopants may be used.

Alternatively, extension sidewalls may be formed on the outer surface of the gate stack and used (along with the gate stack) as the mask to form the extension regions 90. If used, the extension sidewalls may be formed from a single material or may be formed from more than one layer of materials. For example, the extension sidewalls may be comprised of an oxide, oxi-nitride, silicon dioxide, nitride, or any other dielectric material or layers of dielectric materials. The material layers for the extension sidewalls may be formed with any suitable process, such as thermal oxidation, or deposition by ALD, CVD, or PVD. Preferably, at least one layer of the extension sidewall is comprised of a silicon nitride that is formed with a CVD process that uses a bis-t-butylaminosilane ("BTBAS") precursor. Forming the silicon nitride layer with that precursor will help guard against the etching of the extension sidewalls during the process of removing the gate hardmask layer later in the fabrication process (because of the low etch rate of BTBAS in the etching solution that is used for the hardmask layer removal).

At some point after the implantation of the extension regions 90, the extension regions 90 are activated by an anneal process (performed now or later). This anneal step may be performed with any suitable process such as rapid thermal anneal ("RTA").

It is within the scope of the embodiment to also form halo implant regions within the p-well 30 and the n-well 40. The optional halo implants (sometimes called "pocket implants" or "punch through stoppers" because of their ability to stop punch through current) may be formed with any standard implant or diffusion process within (or proximate to) the extension regions 90.

Referring to FIG. 2D, source/drain sidewalls 150 are now formed proximate to the gate stack (or to the extension sidewalls, if used). The source/drain sidewalls 150 may be formed using any standard process and materials. The example source/drain sidewalls 150 may be comprised of a cap oxide and a silicon nitride layer that are formed with a CVD process and subsequently anisotropically etched (preferably using standard anisotropic plasma etch processes). However, it is within the scope of the invention to use more layers (i.e. a spacer oxide layer, a silicon layer, and a final oxide layer) or less layers (i.e. just a silicon oxide layer or a silicon nitride layer) to create the source/drain sidewalls 150. It is to be noted that the semiconductor wafer 10 is usually subjected to a standard post-etch cleaning process after the formation of the source/drain sidewalls 150.

Now the source/drain sidewalls 150 (and the gate stack) are used as a template for the implantation of dopants into the source/drain regions 80 shown in FIG. 2D. The source/drain regions 80 may be formed through any one of a variety of processes, such as deep ion implantation or deep diffusion. The dopants used to create the source/drain regions 80 for a PMOS transistor 60 are typically boron; however, other dopants or combinations for dopants may be used. The dopants used to create the source/drain regions 80 for a NMOS transistor 70 are typically phosphorous or arsenic; however, other dopants or combinations for dopants may be used.

The implantation of the dopants is self-aligned with respect to the outer edges of the source/drain sidewalls 150. After the dopants are implanted, the source/drain regions 80 are activated by an anneal step. (However, the extension region anneal and the source/drain region anneal may be combined and performed at this point in the fabrication process.) This anneal step acts to repair the damage to the semiconductor wafer and to activate the dopants. The activation anneal may be performed by any suitable technique such as RTA (including spike anneal), flash lamp annealing ("FLA"), laser annealing, or a combination thereof. This anneal step often causes lateral and vertical migration of dopants in the extension regions 90 and the sources/drains regions 80. In addition, this anneal step will cause the recrystallization of the ion implant areas 80, 90 (or the full crystallization of the ion implant areas 80, 90 if this is the first anneal).

It is to be noted that the gate hardmask 140 blocked the implantation of dopants into the polysilicon electrode 113 during the implementation processes that were used to form the extension regions 90 and the source/drain regions 80. Specifically, the gate hardmask 140 stores the dopants that were directed to the gate electrode 113 and then those stored dopants are removed when the gate hardmask is removed (as described infra.). As a result, the gate hardmask 140 may protect the gate electrode 113 from an undesirable work function shift.

Figure 2E:
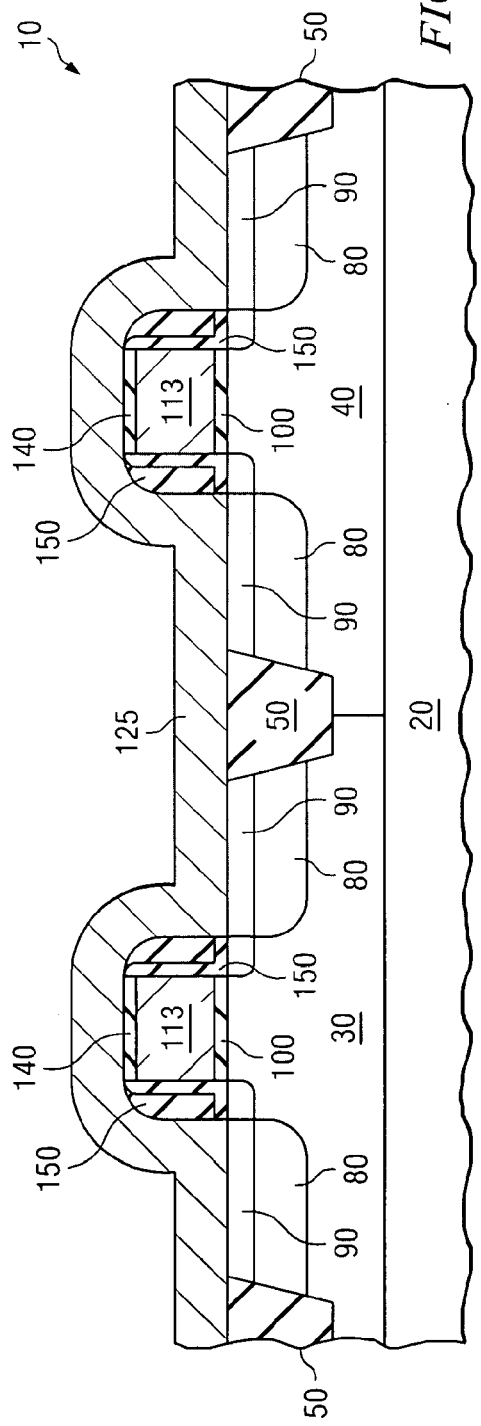
FIGS. 2A-2S are cross-sectional diagrams of a process for forming a transistor in accordance with the present invention.

In the example embodiment, the next step in the manufacturing process is the performance of the source/drain silicide loop. The purpose of the source/drain silicide loop is the creation of a source/drain silicide 120 on the exposed top surface of the source/drain regions 80. Referring to FIG. 2E, the first step of the silicide loop is the deposition of an metal layer 125 over the top surface of the semiconductor wafer 10. The metal layer 125 is preferably comprised of Ni; however, other suitable materials such as Co, Pt, Ti, Ta, Mo, W, or their alloys may be used. In the example application, the silicidation metal layer 125 is between 4-10 nm thick and is formed using a PVD process.

An optional capping layer may also be formed over the metal layer 125. If used, the capping layer acts as a passivation layer that prevents the diffusion of oxygen from ambient into the metal layer 125. The capping layer may be any suitable material, such as TiN, and may be between 5-30 nm thick.

Figure 2F:
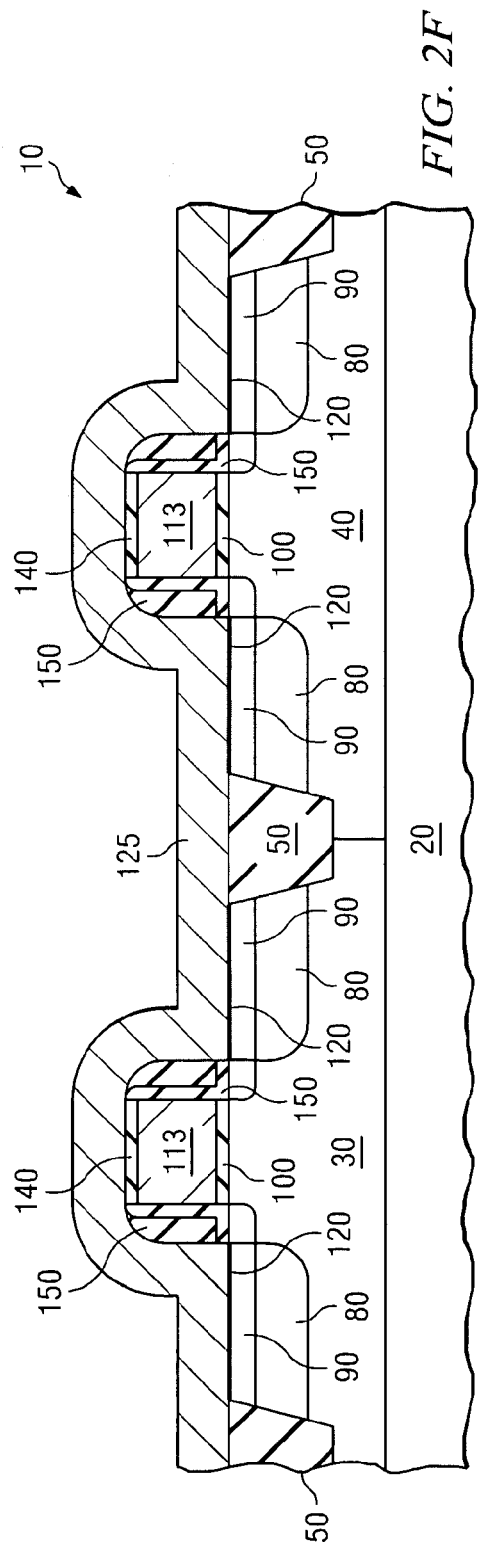

The second step of the silicide loop is an anneal. The semiconductor wafer 10 may be annealed with any suitable process, such as RTA. In the example application, the silicide anneal is performed for 10-60 seconds at a temperature between 300-500° C. This anneal process will cause a silicide 120 (i.e. a Ni-rich silicide or Ni mono-silicide) to form over all active surfaces that are in contact with the metal layer 125; namely, the surface of the source/drain regions 80. These silicide regions 120 are shown in FIG. 2F.

It is to be noted that the metal layer 125 will only react with the active substrate (i.e. exposed Si); namely, the source/drain 80. Therefore, the source/drain silicide 120 formed by this annealing process is considered a self-aligned silicide ("salicide"). It is also to be noted that the gate electrode 113 was not modified by the silicide loop anneal because the gate electrode 113 was protected from the metal layer 125 by the gate hardmask 140 and the source/drain sidewalls 150 (which overlap the gate hardmask 140).

The third step in the silicide loop is the removal of the un-reacted metal layer 125, as shown in FIG. 2G. The un-reacted metal layer 125 (and the capping layer, if used) is removed using any suitable process such as a wet etch process (i.e. using a fluid mixture of sulfuric acid, hydrogen peroxide, and water).

The fourth step of the silicide loop is the performance of a second anneal (such as another RTA) to further react the source/drain silicide 120 with the source/drain regions 80. In the example application, a second silicide anneal is performed for 10-60 seconds at a temperature between 400-600° C. If the initial anneal process of the silicide loop did not complete the silicidation process, this second anneal will ensure the formation of a mono-silicide NiSi—which lowers the sheet resistance of the source/drain silicide 120.

As shown in FIG. 2H, the next step is the conformal deposition of an etch stop layer 200 over the semiconductor wafer 10. Preferably, the etch stop layer 200 is $Si_3N_4$; however, any other suitable material such as bistertianry-butylaminsilane ("BTBAS") may be used. In the example application, the etch stop layer 200 is less than 350 Å thick and it is formed using a standard deposition process.

As also shown in FIG. 2H, a Pre-Metal Deposition ("PMD") isolation layer 210 is deposited over the etch stop layer 200. The PMD isolation layer 210 is preferably TEOS; however, other dielectric materials such as OSG may be used. In the example application, the PMD isolation layer 210 is between 1000-3000 Å thick, and it is formed using a standard deposition process.

Figure 2I:
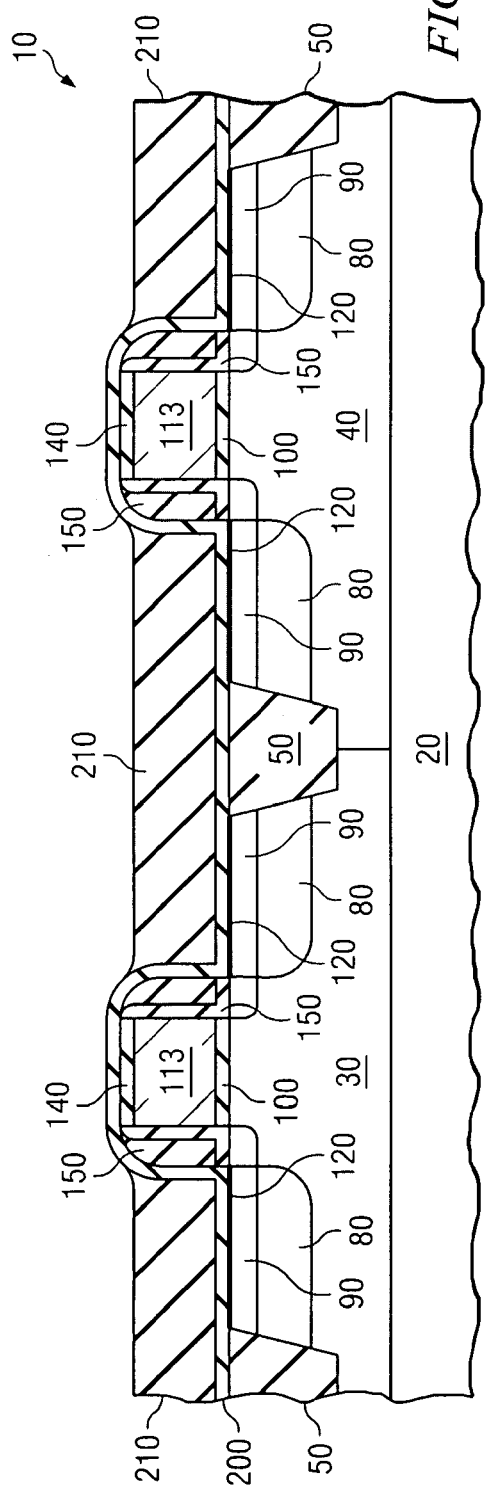

A standard chemical-mechanical polish ("CMP"), which is selective to silicon nitride, is now performed. As shown in FIG. 2I, the CMP continues to planarize the PMD isolation layer 210 until those portions of the etch stop layer 200 that are located over the gate hardmask 140 of the PMOS 60 and NMOS 70 transistors are exposed. However, it is within the scope of the invention to use suitable alternative processes (that are selective to silicon nitride) to expose the portions of the etch stop layer 200 that are located over the gate hardmasks 140. For example, a dry etch process may also be used to reduce the thickness of the PMD isolation layer 210, thereby exposing the highest surfaces of the etch stop layer 200 (which are located over the gate hardmasks 140 of the PMOS 60 and NMOS 70 transistors).

Figure 2J:
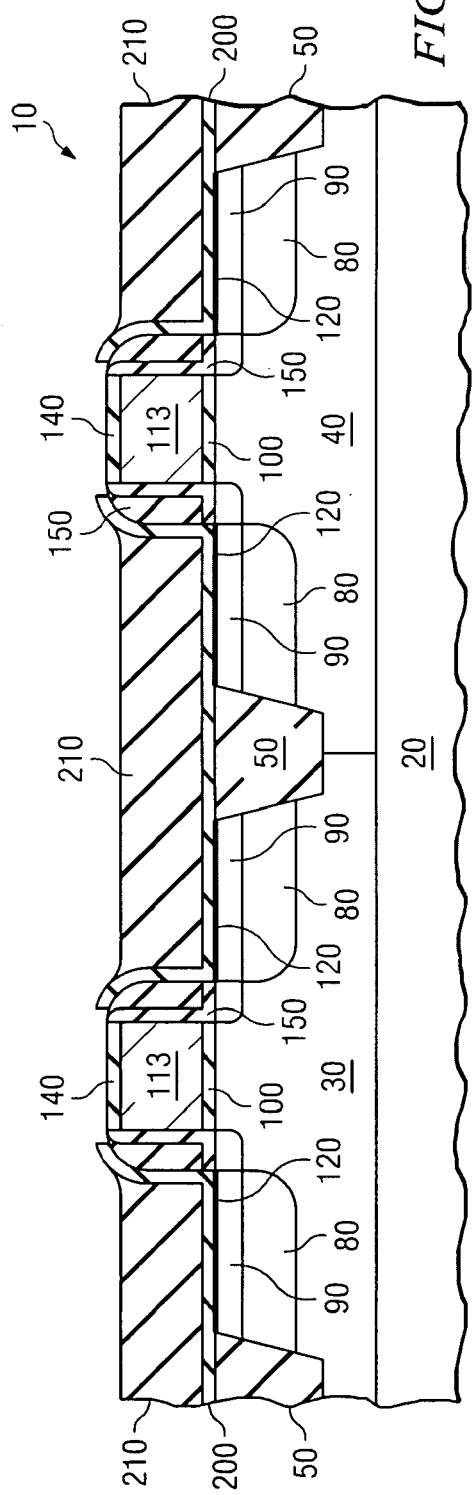

As shown in FIG. 2J, the exposed portion of the etch stop layer 200 is now removed with any suitable process, such as a wet etch (using a solution containing $H_3PO_4$ at a temperature between 160-180° C.) or a dry etch. Also as shown in FIG. 2J, the gate hardmasks 140 of the PMOS transistor 60 and the NMOS 70 transistor are now exposed.

In the example application, the gate hardmask 140 is removed by a wet etch using a dilute HF solution. However, any suitable process may be used to remove the gate hardmask 140, such as a wet etch using buffered HF or a dry etch using anhydrous HF. As noted above the dopants collected in the gate hardmask 140 during the implantation of the source/drain regions (FIG. 2D) are now removed with the gate hardmask 140. Because the source/drain sidewalls 150 were formed with the gate hardmask 140 in place over the gate electrode 113, the source/drain sidewall structures 150 will now stretch beyond the top surface of the gate electrode 113, as shown in FIG. 2K. With the gate hardmask 140 removed, the polysilicon gate electrode 113 is now exposed and therefore available for dopant implantation to tune the work function of the PMOS 60 and NMOS 70 transistors. As noted supra, the dopants intercepted and stored in the gate hardmask 140 (to protect the poly gate electrode 113 from the source/drain implantation step) are removed with gate hardmask material during this etch step.

As discussed supra, the work function of the PMOS transistor 60 and the NMOS transistor 70 is adjusted with different dopant types; therefore, the work function adjustment implant is performed on the PMOS transistor 60 and the NMOS transistor 70 in separate steps. In the example application the work function of the PMOS transistor is adjusted first. (However, those skilled in the art realize that the work function of the NMOS transistor could be adjusted first.) A standard photoresist process is used to initially form a layer of photoresist over the semiconductor wafer 10 and then the photoresist layer patterned and developed to form a patterned photoresist layer 220 that simultaneously protects the region containing the NMOS transistor while exposing the region containing the PMOS transistor, as shown in FIG. 2L.

The PMOS work function adjustment implant 230 is now performed on the exposed region containing the PMOS transistor 60. Specifically, p-type dopants selected from the Group IIIa series (e.g. B, Al, Ga, In, Tl) are implanted into the exposed gate electrode 113 of the PMOS transistor 60. In the example application, Ga is implanted into the gate electrode 113 with a standard high current implanter (such as the high current implanters sold by Varian or Axcellis). Moreover, the Group IIIa series dopant is implanted into the upper ⅓ of the gate electrode 113 in order to guard against the diffusion of the Group IIIa series dopants past the gate dielectric 100 (into the channel region) during any subsequent anneal process. Any suitable process parameters may be used, such as a dose of $2\times10^{14}$ to $2\times10^{15}$ atoms/cm$^2$ and an energy of 5 to 20 keV. In the example application, the PMOS transistor has a work function of approximately 5.0 eV.

It is within the scope of the invention to also simultaneously implant oxygen into the gate electrode 113 to push the work function of the PMOS transistor 60 containing the Group IIIa dopants toward the silicon band edge. The O or $O_2$ implant can be done either before or after the Group IIIa implant in the PMOS transistor 60. This optional implant provides further control of the tuning of the gate electrode work function during the fabrication of the semiconductor wafer 10.

It is also within the scope of the invention to etch a portion of the gate electrode 113 after the work function implant to create a nickel-rich FUSI gate electrode 110, thereby increasing the work function of the PMOS FUSI gate electrode 110. Any suitable process may be used to reduce the height of the gate electrode 110, such as a standard wet or dry etch.

It is to be noted that in the example application that the Ga dopant interacts with the oxygen within the gate dielectric 100, creating a layer of $Ga_2O_3$ that is preferably located close to the interface between the gate dielectric 100 and the Ga implanted gate electrode 113. The presence of Ga in the gate dielectric 100 may cause an increase in the k value of the gate dielectric 100. However, the presence of $Ga_2O_3$ at or near the interface between the gate dielectric 113 and the silicon substrate 20 may cause undesirable consequences, such as decreased channel mobility and increased gate dielectric leakage.

A standard ash and clean process is used to remove the patterned photoresist 220 over the NMOS region and now the work function adjustment implant process is performed on the NMOS region. First, a standard photoresist process is used to form a layer of photoresist over the semiconductor wafer 10 and then the photoresist layer is patterned and developed to form a patterned photoresist layer 220 that simultaneously protects the region containing the PMOS transistor while exposing the region containing the NMOS transistor, as shown in FIG. 2M.

The NMOS work function adjustment implant 240 is now performed on the exposed region containing the NMOS transistor 70. Specifically, n-type dopants selected from the lanthanide series (e.g. Yb, Gd, Ce, Pr, Nd, Sm, Eu, Tb, Dy, Ho, Er, Tm) are implanted into the exposed gate electrode 113 of the NMOS transistor 70. In the example application, Yb is implanted into the gate electrode 113 with a standard high current implanter (such as the high current implanters sold by Varian or Axcellis). Moreover, the lanthanide series dopant is implanted into the upper ⅓ of the gate electrode 113 in order to guard against the diffusion of the lanthanide series dopants past the gate dielectric 100 (into the channel region) during any subsequent anneal process. Any suitable process parameters may be used, such as an implantation of Yb species at a dose of $1\times10^{14}$ to $5\times10^{15}$ atoms/cm$^2$ and energy of 15 to 30 keV. In the example application, the NMOS transistor 70 has a work function of approximately 4.1 eV.

It is within the scope of the invention to also simultaneously implant standard n-type dopants, such as As, P, Sb, or a combination thereof, into the gate electrode 113 to adjust the work function of the NMOS transistor 70 containing lanthanide element dopants away from the band edge of silicon. This optional implant supports additional tuning of the work function of the lanthanide implanted NMOS transistor 70. If used, this optional implant is performed before the work function adjustment implant 240 because an n-type dopant (such as As) will probably facilitate the out diffusion of the lanthanide series dopant during the work function adjustment implant 240 (thereby moving the work function away from the band edge).

It is to be noted that in the example application that the Yb dopant interacts with the oxygen within the gate dielectric 100, creating a layer of $Yb_2O_3$ that is preferably located close to the interface between the gate dielectric 100 and the Yb-implanted gate electrode 113. The presence of Yb in the gate dielectric 100 may cause in increase in the k value of the gate dielectric 100. However, the presence of $Yb_2O_3$ at or near the interface between the gate dielectric 113 and the silicon substrate 20 may cause undesirable consequences, such as decreased channel mobility and increased gate dielectric leakage.

It is also to be noted that the dopants implanted during the work function adjustment implantation steps 230 and 240 will not be affected by the anneal temperatures used earlier to anneal the source/drain regions 80 (and the extension regions 90). Therefore the reduced thermal budget of the work function implant processes 230, 240 of this example application accommodate a more sensitive tuning of the work function (than can be realized with the large thermal budget of the source/drain anneal in combination with the work function adjustment implant).

The PMD isolation layer 210 (and the etch stop layer 200) protected the silicided source/drain region 80 from the work function adjustment implants 230, 240. In addition, the PMD isolation layer 210 (and the etch stop layer 200) will protect the silicided source/drain region 80 from the gate silicide process (infra).

Figure 2O:
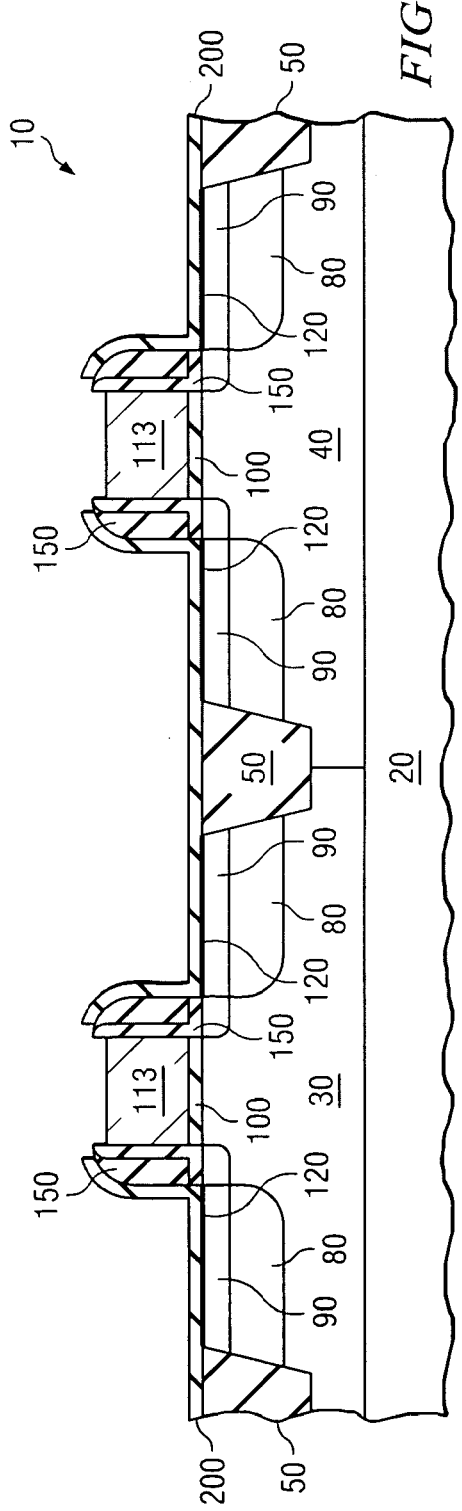

A standard ash and clean process is used to remove the patterned photoresist 220 over the PMOS region, as shown in FIG. 2N, and the semiconductor wafer 10 is now prepared for the gate silicide loop. Specifically, the semiconductor wafer 10 is prepared for the gate silicide loop by removing the PMD isolation layer 210 with any suitable process, such as a wet clean (using dilute HF) or a back grind process. As shown in FIG. 2O, the etch stop layer 200 remains on the semiconductor wafer 10 during the gate silicide loop in order to protect the silicided source/drain regions 80 from increased silicidation. In addition, a standard etch may be performed to reduce the height of the PMOS gate electrode 113 before the gate silicide loop is performed. This optional step of reducing the height of the PMOS gate electrode 113 facilitates the formation of a nickel-rich silicide in the PMOS transistor 60, thereby increasing the work function of the FUSI gate electrode 110.

Figure 2P:
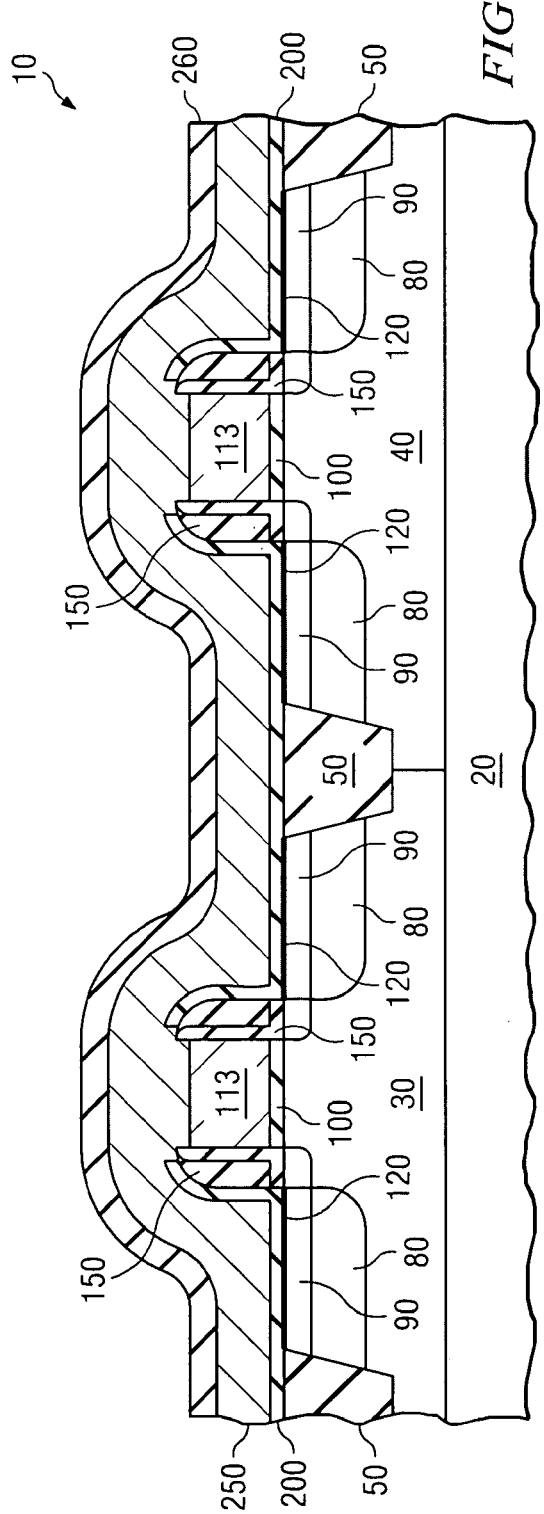

As shown in FIG. 2P, a gate metal layer 250 is now formed over the semiconductor wafer 10. The metal layer 250 is preferably comprised of nickel; however, other suitable materials such as cobalt, platinum, titanium, tantalum, molybdenum, tungsten, or an alloy may be used. Preferably, the metal layer 250 is designed to fully silicidize the polysilicon electrode 250. As it takes approximately 1 nm of nickel to fully silicidize approximately 1.8 nm of polysilicon, the thickness of the metal layer 250 should be at least 56% of the thickness of the polysilicon gate electrode 113. To provide process margin, it is suggested that the thickness of the metal layer 250 should be at least 60% of the thickness of the polysilicon gate electrode 113.

An optional capping layer 260 may also be formed over the metal layer 250. If used, the capping layer 230 acts as a passivation layer that prevents the diffusion of oxygen from ambient into the metal layer 250. The capping layer may be any suitable material, such as TiN or Ti. In the example application, the optional capping layer 260 is between 5-30 nm thick.

In accordance with the invention, the semiconductor wafer 10 is now annealed with any suitable process 270, such as a RTA. In the example application, the silicide anneal is performed for 10-60 seconds at a temperature between 300-500° C. In the example application, the polysilicon gate electrode 113 becomes a fully silicided ("FUSI") gate electrode 110, as shown in FIG. 2Q. It is to be noted that the metal layer 250 will not react with the silicided sources/drains 80 because they are protected from further silicidation by their previously formed etch stop layer 200.

The next step is the removal of the un-reacted portions of the silicidation metal layer 250, as shown in FIG. 2R. The metal layer 250 (and the capping layer 260, if used) is removed with any suitable process such as a selective wet etch process (i.e. using a fluid mixture of sulfuric acid, hydrogen peroxide, and water).

It is within the scope of the invention to perform another silicide anneal (such as another RTA) at this point in the manufacturing process in order to further react the gate silicide 110. In the example application, the second silicide anneal is performed for 30-120 seconds at a temperature between 400-600° C. If the initial anneal process did not complete the silicidation process, this second anneal will ensure the formation of a NiSi having a lowered sheet resistance. As stated above, the gate electrode 110 is fully silicided ("FUSI") through the silicidation process in the example application.

It is to be noted that the lanthanide series dopant contained within the NMOS transistor 70 will diffuse during the anneal steps of the gate silicide loop (causing lanthanide elements to react with the gate dielectric 100). As a result, the NMOS transistor 70 will have a higher k value (plus a higher capacitance) and the gate leakage may be reduced.

As shown in FIG. 2S, the gate silicide loop will form a nickel-rich silicide 111 within the PMOS gate electrode if the height of the PMOS gate electrode 113 was reduced before the gate silicidation process, as discussed supra. The presence of a nickel-rich silicide may allow the PMOS transistor 60 to have an increased work function.

Figure 3B:
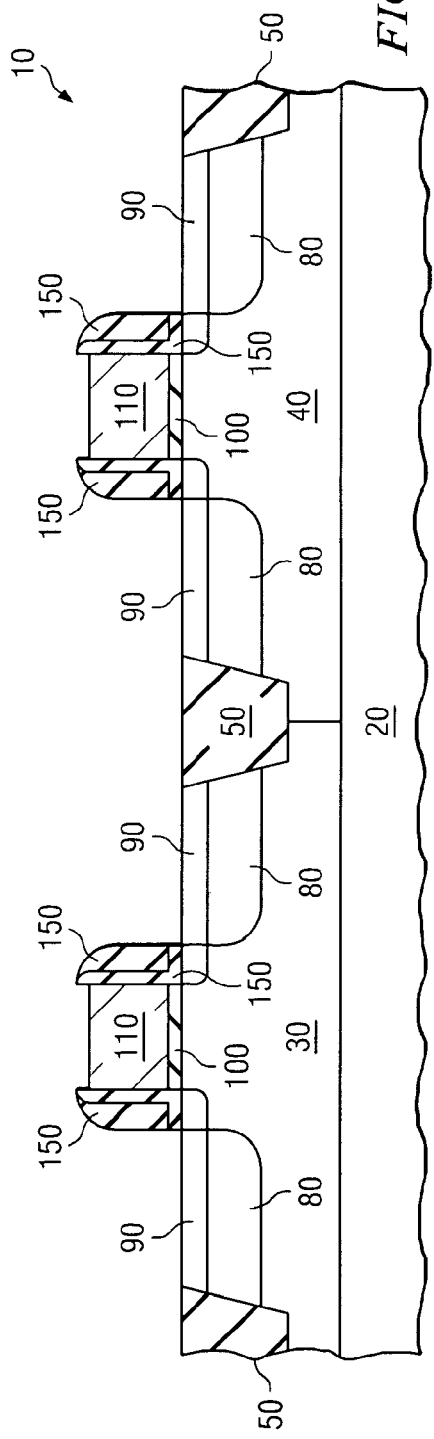

It is within the scope of the invention to perform the source/drain silicide loop after the gate silicide loop, as shown in FIGS. 3A-3E, instead of performing the source/drain silicide loop before the gate silicide loop, as discussed supra. With this alternative fabrication process, the etch stop layer 200 and the PMD isolation layer 210 would be formed over the semiconductor wafer 10 after the formation of the source/drain regions, as shown in FIG. 3A. Then the subsequent steps of the invention discussed above and shown in FIGS. 2I-2S would be performed. Once the gate silicide loop is complete (FIG. 2R or 2S), the semiconductor wafer 10 is prepared for the silicide loop by removing the etch stop layer 200, as shown in FIG. 3B. Now the semiconductor wafer 10 is ready for the silicide loop, which forms the silicide 120 on the exposed upper surface of the source/drain regions 80.

Figure 3C:
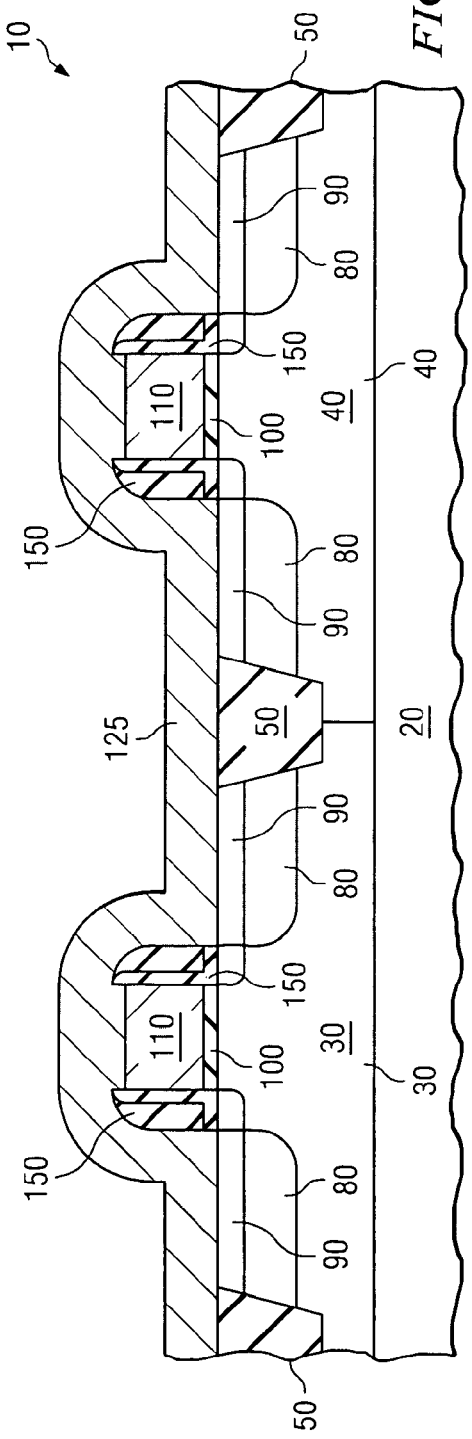
Figure 3D:
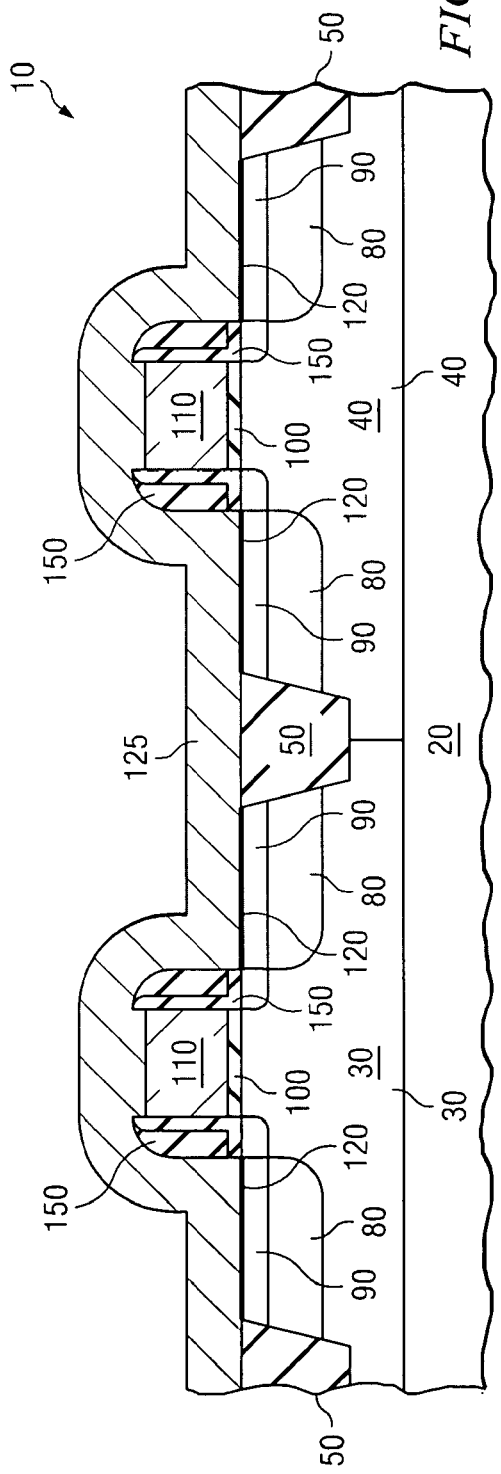

Using the silicide loop process describe above, a metal layer 125 (plus an optional capping layer, if used) is formed over the semiconductor wafer 10, as shown in FIG. 3C. The semiconductor wafer 10 is then annealed (using an RTA process) in order to form the source/drain silicide films 120, as also shown in FIG. 3D.

Figure 3E:
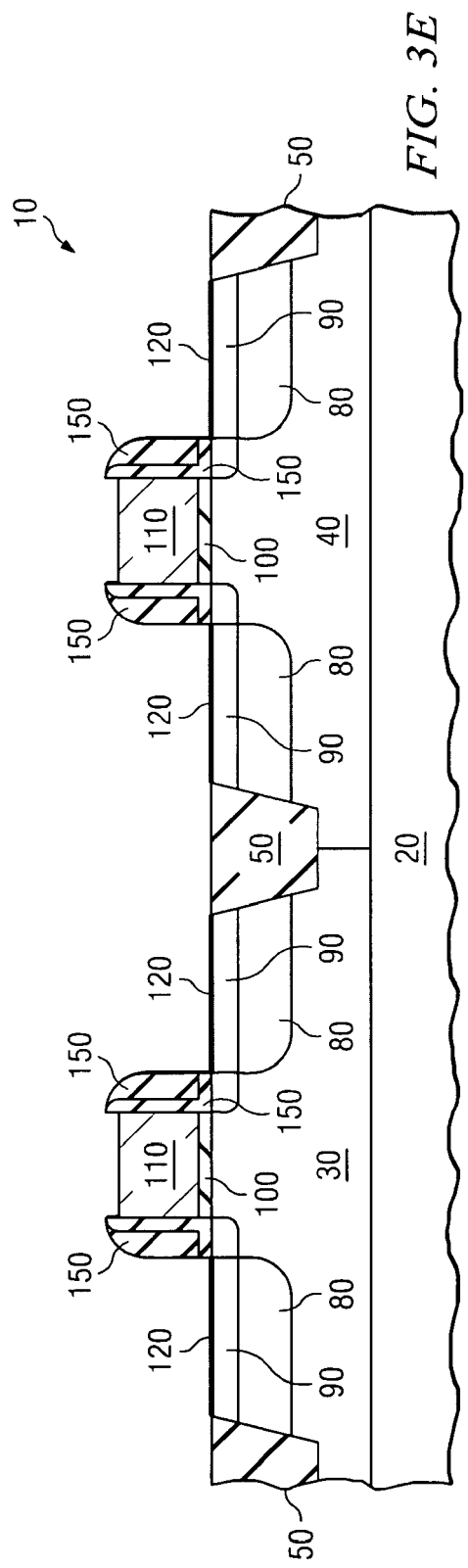

As shown in FIG. 3E, the un-reacted metal layer 125 (and the optional capping layer, if used) is now removed with a wet etch process and the semiconductor wafer 10 may now be subjected to a second RTA silicide anneal, as described above.

Upon completion of the formation of source/drain silicides 120, the work function adjustment implant, and the formation of the gate FUSI electrodes 110—using any of the process flows described above—the fabrication of the semiconductor wafer 10 now continues (using standard process steps) until the semiconductor device is complete. Generally, the next step is the formation of the dielectric insulator layer 160 using plasma-enhanced chemical vapor deposition ("PECVD") or another suitable process (see FIG. 1). The dielectric insulator 160 may be comprised of any suitable material such as $SiO_2$ or OSG. (However, a dielectric liner may be formed over the semiconductor wafer 10 before the placement of the dielectric insulator 160.)

The contacts 170 are formed by etching the dielectric insulator layer 160 to expose the desired gate, source and/or drain. The etched spaces are usually filled with a liner 180 to improve the electrical interface between the silicide and the contact 170. Then contacts 170 are formed within the liner 180; creating the electrical interconnections between various semiconductor components located within the semiconductor substrate 20.

As discussed above, the fabrication of the final integrated circuit continues with the fabrication of the back-end structure. Once the fabrication process is complete, the integrated circuit will be tested and then packaged.

Example modifications to the described embodiments may include interfacial layers may be formed between any of the layers shown. In addition, any of the implant processes may be followed by a post ion implantation clean. Furthermore, an anneal process may be performed after any step in the above-described fabrication process. When used, the anneal process can improve the microstructure of materials and thereby improve the quality of the semiconductor structure. Additionally, if a metal other than Ni is used then higher temperatures may be required for the described anneal processes. Those skilled in the art will appreciate that many other variations and other embodiments are possible within the scope of the claimed invention.

The invention claimed is:

1. A method, comprising:
 forming a semiconductor substrate which has p-well and n-well;
 forming a gate dielectric over the semiconductor substrate;
 forming a gate electrode over the gate dielectric;
 forming a hard mask over the gate electrode;
 patterning and etching the hard mask and gate electrode stack to define the NMOS and PMOS electrodes over the p-well and n-well regions respectively of the substrate;
 masking with photo resist the NMOS electrode;
 removing the hard mask over the PMOS electrode;
 implanting a p-type Group IIIa series dopant into the PMOS electrode;
 removing the photo resist over the NMOS electrode;
 masking with photo resist the PMOS electrode;
 removing the hard mask over the NMOS electrode;
 implanting a n-type lanthanide series dopant into the NMOS electrode;
 removing the photo resist over the PMOS electrode;
 depositing nickel; and
 siliciding the nickel,
 wherein the p-type Group IIIa series dopant includes Ga that interacts with oxygen to form a layer of $Ga_2O_3$ proximate an interface between the gate dielectric and the Ga implanted gate electrode.

2. A method, comprising:
 forming a semiconductor substrate which has p-well and n-well;
 forming a gate dielectric over the semiconductor substrate;
 forming a gate electrode over the gate dielectric;
 forming a hard mask over the gate electrode;
 patterning and etching the hard mask and gate electrode stack to define the NMOS and PMOS electrodes over the p-well and n-well regions respectively of the substrate;
 masking with photo resist the NMOS electrode;
 removing the hard mask over the PMOS electrode;
 implanting at least one of B, Al, Ga, In or Tl selectively into an upper ⅓ of the electrode of the PMOS;
 removing the photo resist over the NMOS electrode;
 masking with photo resist the PMOS electrode;
 removing the hard mask over the NMOS electrode;
 implanting Yb into the NMOS electrode;
 removing the photo resist over the PMOS electrode;
 depositing nickel; and
 siliciding the nickel.

3. The method of claim 1, wherein the gate electrode comprises silicon; and the method further comprises siliciding at least a portion of the silicon of the gate electrode of each stack.

4. The method of claim 3, wherein the silicon of the gate electrode of each stack is fully silicided.

5. The method of claim 1, wherein the p-type Group IIIa series dopant is implanted into an upper ⅓ of the gate electrode of the stack over a first region.

6. The method of claim 1, wherein the p-type Group IIIa series dopant includes Ga.

7. The method of claim 1, further comprising also implanting oxygen selectively into the gate electrode of the stack over a first region, while masking the gate electrode of a stack over a second region.

8. The method of claim 1, wherein the n-type lanthanide series dopant includes Yb.

9. The method of claim 1, wherein the n-type lanthanide series dopant is implanted into an upper ⅓ of the gate electrode of the stack over a second region.

10. The method of claim 1, further comprising also implanting an n-type non-lanthanide series dopant selectively into the gate electrode of the stack over a second region, while masking the gate electrode of the stack over a first region.

11. The method of claim 10, wherein the n-type non-lanthanide series dopant includes at least one of As, P or Sb.

12. The method of claim 1, wherein the n-type lanthanide series dopant includes Yb that interacts with oxygen to form a layer of $Yb_2O_3$ proximate an interface between the gate dielectric and the semiconductor substrate.

13. The method of claim 1, further comprising adjusting the thickness of the electrode of the gate stack of whichever stack had the hard mask removed.

14. The method of claim 13, wherein the polysilicon of the gate electrode is fully silicided to form a nickel silicide, wherein a first electrode is etched thinner than the second electrode, and silicided to be a NiSi, whereas a second electrode silicided into Ni2Si or other nickel rich phase.

15. The method of claim 13, wherein a first electrode is NMOS, and a second electrode is PMOS.

16. The method of claim 1, further comprising removing the gate hardmask from a second gate after the removal of a first gate, but before the siliciding.

17. The method of claim 1, further comprising removing the gate hardmask over first electrode and a second electrode concurrently.

18. The method of claim 1, further comprising forming an extension region after a defining of the patterning after the patterning of the gate electrodes.

19. The method of claim 18, further comprising wherein the gate hardmask blocks the implantation of the p-type and n-type dopants into the respective electrodes during the implementation processes that were used to form the extension regions and the source/drain regions.

20. The method of claim 1, wherein the silicidation drives the nickel further down into an interface of the stack into the silicon, that diffusion front pushes the diffusion down to the front of the dielectric.

21. The method of claim 18, further comprising wherein the gate hardmask blocks the implantation of the p-type and n-type dopants into the respective electrodes during the implementation processes that were used to form the extension regions and the source/drain regions.

22. The method of claim 2, further comprising adjusting the thickness of the electrode of the gate stack of whichever stack had the hard mask removed.

23. The method of claim 22, wherein the polysilicon is fully silicided to form a nickel silicide, wherein a first electrode is etched thinner, and silicided to be a NiSi, whereas a second electrode is less etched, and therefore, Ni2Si or other nickel rich phase.

24. The method of claim 22, further comprising removing the gate hardmask from a second gate after the removal of a first gate, but before the siliciding.

25. The method of claim 2, further comprising removing the gate hardmask over first electrode and a second electrode concurrently.

26. The method of claim 2, further comprising forming an extension region after the defining of the patterning after the patterning of the gate electrodes.

27. The method of claim 26, further comprising wherein the gate hardmask blocks the implantation of the p-type and n-type dopants into the respective electrodes during the implementation processes that were used to form the extension regions and the source/drain regions.

\* \* \* \* \*